United States Patent
Ohta et al.

(10) Patent No.: US 10,698,043 B2
(45) Date of Patent: Jun. 30, 2020

(54) TRIAXIAL MAGNETIC SENSOR AND METHOD OF MANUFACTURING SUCH

(71) Applicant: TDK Corporation, Tokyo (JP)

(72) Inventors: Naoki Ohta, Tokyo (JP); Hirokazu Takahashi, Tokyo (JP); Satoshi Miura, Tokyo (JP)

(73) Assignee: TDK Corporation, Tokyo (JP)

( * ) Notice: Subject to any disclaimer, the term of this patent is extended or adjusted under 35 U.S.C. 154(b) by 49 days.

(21) Appl. No.: 15/715,348

(22) Filed: Sep. 26, 2017

(65) Prior Publication Data

US 2018/0172781 A1    Jun. 21, 2018

(30) Foreign Application Priority Data

Dec. 20, 2016   (JP) .................................. 2016-246618

(51) Int. Cl.
| | |
|---|---|
| *G01R 33/02* | (2006.01) |
| *G01R 33/09* | (2006.01) |
| *G01R 33/00* | (2006.01) |

(52) U.S. Cl.
CPC ..... *G01R 33/0206* (2013.01); *G01R 33/0052* (2013.01); *G01R 33/093* (2013.01); *G01R 33/098* (2013.01)

(58) Field of Classification Search
CPC .......................... G01R 33/093; G01R 33/0206
See application file for complete search history.

(56) References Cited

U.S. PATENT DOCUMENTS

| | | |
|---|---|---|
| 2009/0231762 A1 | 9/2009 | Ohta et al. |
| 2013/0134969 A1 | 5/2013 | Ohta et al. |

(Continued)

FOREIGN PATENT DOCUMENTS

| | | |
|---|---|---|
| DE | 11 2013 004 975 T5 | 8/2015 |
| DE | 10 2016 104 208 A1 | 9/2016 |

(Continued)

OTHER PUBLICATIONS

Futoyoshi Kou. "Development of Tunneling Magneto-resistive Sensors." Tohoku R&D Center, Research and Development Group. Ricoh Technical Report No. 31, pp. 39-46, Dec. 2005. (English abstract attached).

(Continued)

*Primary Examiner* — Minh Q Phan
(74) *Attorney, Agent, or Firm* — Posz Law Group, PLC

(57) ABSTRACT

A triaxial magnetic sensor that can detect with high precision magnetic fields in three axial directions comprises a substrate having a first surface and a second surface opposite the first surface, and a magnetic sensor element group provided on the first surface. The magnetic sensor element group includes a first magnetic sensor element for magnetic detection in the x-axis direction, a second magnetic sensor element for magnetic detection in the y-axis direction and a third magnetic sensor element for magnetic detection in the z-axis direction. The first through third magnetic sensor elements respectively contain first through third magnetoresistive effect elements composed of laminated bodies including at least a magnetization fixed layer and a free layer, and the magnetization direction of each of the magnetization fixed layers of the first through third magnetoresistive elements is fixed in a direction inclined at a prescribed angle with respect to the first surface.

6 Claims, 7 Drawing Sheets

(56) References Cited

U.S. PATENT DOCUMENTS

2015/0285873 A1 10/2015 Cai et al.
2018/0275219 A1* 9/2018 Umetsu ................ G01R 33/093

FOREIGN PATENT DOCUMENTS

| EP | 1 830 407 A1 | 9/2007 |
| JP | 2001-356154 A | 12/2001 |
| JP | 2005-249554 A | 9/2005 |
| JP | 2013-108923 A | 6/2013 |
| JP | 2016-072555 A | 5/2016 |

OTHER PUBLICATIONS

Office Action dated Jan. 21, 2019 in corresponding German Patent Application No. 102017123789.5 (English translation only).

* cited by examiner

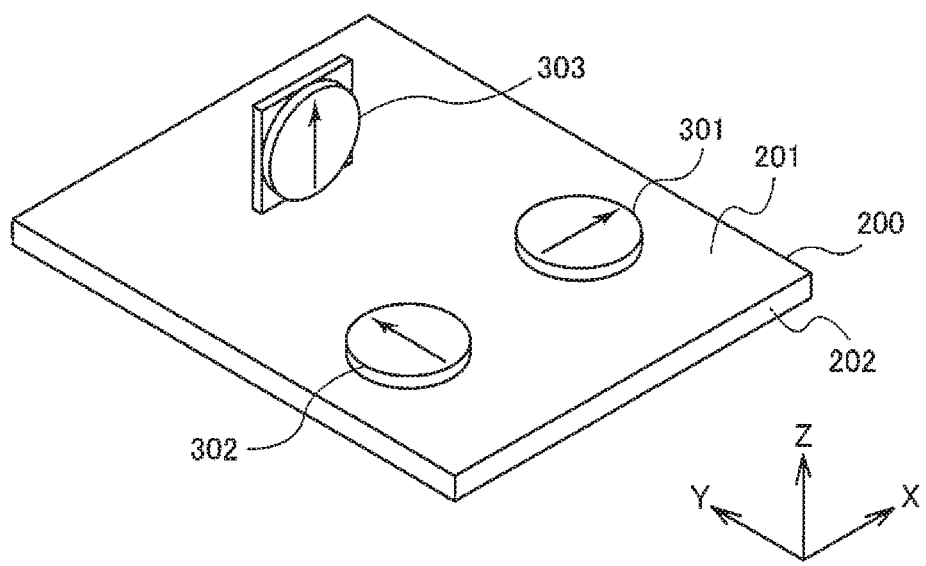

TRIAXIAL MAGNETIC SENSOR AND METHOD OF MANUFACTURING SUCH

CROSS REFERENCE TO RELATED APPLICATIONS

The present application is based on Japanese Patent Application No. 2016-246618 filed on Dec. 20, 2016, the disclosure of which is incorporated herein by reference.

FIELD OF THE INVENTION

The present invention relates to a triaxial magnetic sensor and a method of manufacturing the triaxial magnetic sensor.

BACKGROUND OF THE INVENTION

Conventionally, an electronic compass for measuring direction by detecting geomagnetism by a magnetic sensor element has been installed in mobile terminals such as mobile phones and vehicle-mounted navigation systems. As a triaxial magnetic sensor used for detecting magnetic field components in three mutually orthogonal axial (x-axis, y-axis and z-axis) directions used in this kind of electronic compass, a sensor has been known in which three magnetic sensor elements which are an x-axis magnetic sensor element, a y-axis magnetic sensor element and a z-axis magnetic sensor element, are installed on a single substrate surface.

In such a triaxial magnetic sensor, it is necessary to have the direction of sensitivity to magnetic fields in each of the magnetic sensor elements be orthogonal to detect magnetic field components in three mutually orthogonal axial directions by the three magnetic sensor elements, respectively. When using, as the magnetic sensor elements, a magneto-resistive effect element (for example, a TMR element) that is a laminated body having a free layer and a magnetization fixed layer, in which the direction of magnetization of the free layer changes with high sensitivity in accordance with an external magnetic field and in which the resistance changes accompanying such, each magnetic sensor element is positioned such that the magnetization direction of the magnetization fixed layer of each magnetic sensor element faces in each of the directions.

For example, as shown in FIG. 16, an x-axis TMR element 301 and a y-axis TMR element 302 are laminated and formed on a first surface 201 of a substrate 200 having a first surface 201 and a second surface 202 opposite to the first surface 201, and a z-axis TMR element 303 is laminated and formed in a direction orthogonal to the first surface 201. In FIG. 16, arrows displayed overlaying each of the TMR elements 301~303 indicate the magnetization direction of the magnetization fixed layer of each of the TMR elements 301~303. In a triaxial magnetic sensor having this kind of configuration, the magnetization directions of the magnetization fixed layers of each of the TMR elements 301~303 can be respectively caused to face the three axial directions (see Non-Patent Literature 1).

PRIOR ART

Non-Patent Literature

[NON-PATENT LITERATURE 1] "Development of Tunneling Magneto-resistive Sensors", Futoyoshi KOU, Ricoh Technical Report, No. 31, 2005.

SUMMARY OF THE INVENTION

Problems Solved by the Invention

In the triaxial magnetic sensor shown in FIG. 16, the x-axis TMR element 301 and the y-axis TMR element 302 are manufactured through the same process, and thus the properties thereof can be easily made to match.

However, the lamination direction of the z-axis TMR element 303 is different from (orthogonal to) the x-axis TMR element 301 and the y-axis TMR element 302, so it is extremely difficult to manufacture the z-axis TMR element 303 through the same process as the x-axis TMR element 301 and the y-axis TMR element 302.

Consequently, it is extremely difficult to make the properties of the x-axis TMR element 301 and the y-axis TMR element 302, and of the z-axis TMR element 303, match, and, as a result, there is a problem that the magnetic field detection precision in the three axial directions diminishes.

In consideration of the foregoing, it is an objective of the present invention to provide a triaxial magnetic sensor that can detect magnetic fields in three axial directions with high precision, and a method of manufacturing such.

Problem Resolution Means

In order to resolve the above-described problem, the present invention provides a triaxial magnetic sensor is provided with: a substrate including a first surface and a second surface, which is opposite to the first surface; and a magnetic sensor element group provided on the first surface of the substrate; wherein the magnetic sensor element group includes a first magnetic sensor element for detecting magnetism in a first axial direction, a second magnetic sensor element for detecting magnetism in a second axial direction, and a third magnetic sensor element for detecting magnetism in a third axial direction; the first axial direction and the second axial direction are mutually orthogonal directions on a plane containing the first axial direction and the second axial direction; the third axial direction is a direction orthogonal to the plane containing the first axial direction and the second axial direction; the first through third magnetic sensor elements contain first through third magneto-resistive effect elements, respectively; the first through third magneto-resistive effect elements are all laminated bodies containing at least a magnetization fixed layer and a free layer; and the magnetization direction of each of the magnetization fixed layers of the first through third magneto-resistive effect elements is fixed in a direction inclined at a prescribed angle with respect to the first surface of the substrate (Invention 1).

In the above-described invention (Invention 1), the first through third magneto-resistive effect elements are each preferably a laminated body in which the magnetization fixed layer and the free layer are layered along a direction orthogonal to the first surface of the substrate (Invention 2).

In the above-described invention (Invention 1), the magnetization direction of each of the magnetization fixed layers of the first through third magneto-resistive effect elements is preferably fixed in a direction inclined at an angle of 15~55° with respect to the first surface of the substrate (Invention 3).

In the above-described invention (Invention 1), in the planar view viewed from above the first surface of the substrate, when the magnetization direction of the magnetization fixed layer of the first magneto-resistive effect element, the magnetization direction of the magnetization fixed layer of the second magneto-resistive effect element and the magnetization direction of the magnetization fixed layer of the third magneto-resistive effect element are respectively projected onto the first surface of the substrate, the projected magnetization directions are preferably fixed to face directions mutually differing by 110~130° (Invention 4).

In the above-described invention (Invention 1), it is possible to use GMR elements or TMR elements as the magneto-resistive effect elements (Invention 5).

In addition, the present invention provides a method of manufacturing a triaxial magnetic sensor, being a method for manufacturing the triaxial magnetic sensor according to the above-described invention (Invention 1), this method including: a process for forming a laminated film including at least an antiferromagnetic film configuring the magnetization fixed layer and a magnetic film comprising the free layer, on the first surface of the substrate; a process for forming first through third laminated structures by milling the laminated film; and a process for causing the magnetization direction of the magnetization fixed layer to be fixed at a prescribed angle with respect to the first surface of the substrate, by simultaneously impressing a magnetic field on the first through third laminated structures (Invention 6).

In the above-described invention (Invention 6), the magnetization direction of the magnetization fixed layer is preferably fixed at an angle of 15~55° with respect to the first surface of the substrate (Invention 7), and in the planar view viewed from above the first surface of the substrate, when the magnetization direction of the magnetization fixed layer of the first laminated structure, the magnetization direction of the magnetization fixed layer of the second laminated structure and the magnetization direction of the magnetization fixed layer of the third laminated structure are respectively projected onto the first surface of the substrate, the projected magnetization directions are preferably fixed to face directions mutually differing by 110~130° (Invention 8).

In the above-described invention (Invention 6), it is preferable that in the planar view viewed from above the first surface of the substrate, the first through third laminated structures are positioned with a spacing of 120° in the circumferential direction centered on a prescribed point on the first surface; and a magnetic field is impressed on the first through third laminated structures from a magnetic field impressing device while the magnetic field impressing device being is positioned at a position on the second surface side of the substrate facing a prescribed point on the first surface (Invention 9).

Efficacy of the Invention

With the present invention, it is possible to provide a triaxial magnetic sensor that can detect magnetic fields in three axial directions with high precision, and a method of manufacturing such.

BRIEF DESCRIPTION OF THE DRAWINGS

FIG. 16 is a perspective view showing the summary configuration of a conventional triaxial magnetic sensor.

DETAILED DESCRIPTION OF THE INVENTION

Figure 1:
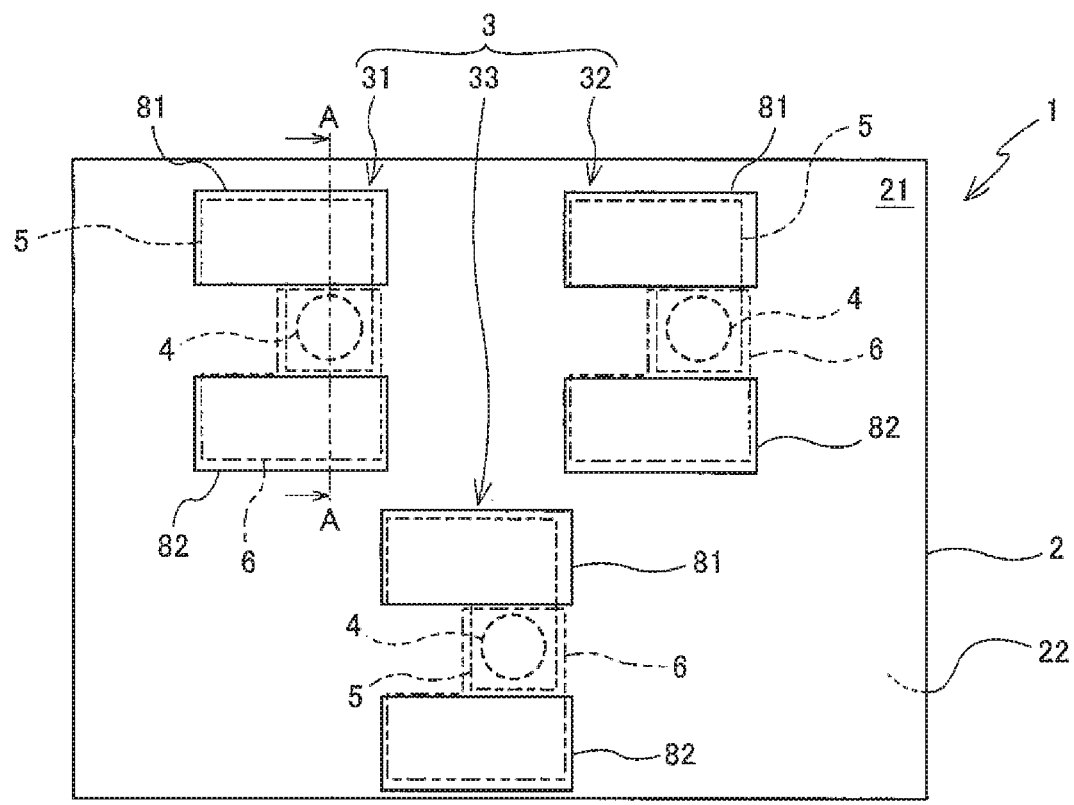
FIG. 1 is a plan view showing a summary configuration of a triaxial magnetic sensor according to an embodiment of the present invention.
Figure 3:
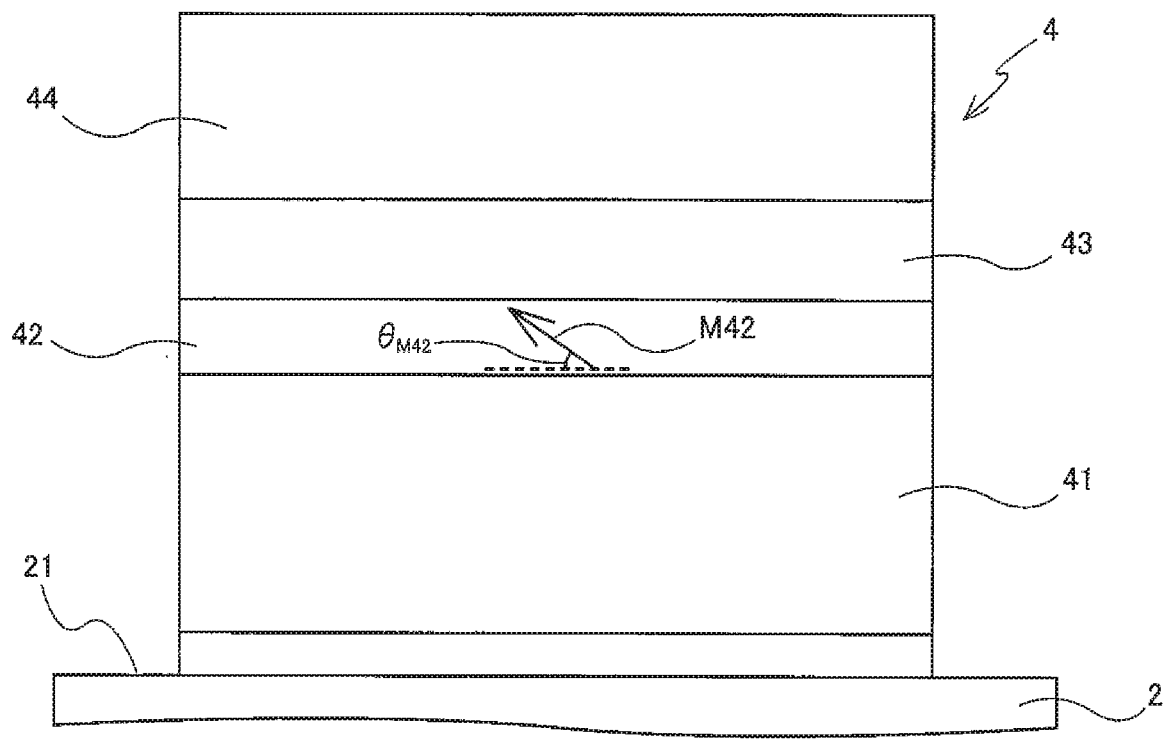
FIG. 3 is a cross-sectional view showing a summary configuration of a magneto-resistive effect laminated body in the embodiment of the present invention.
Figure 4:
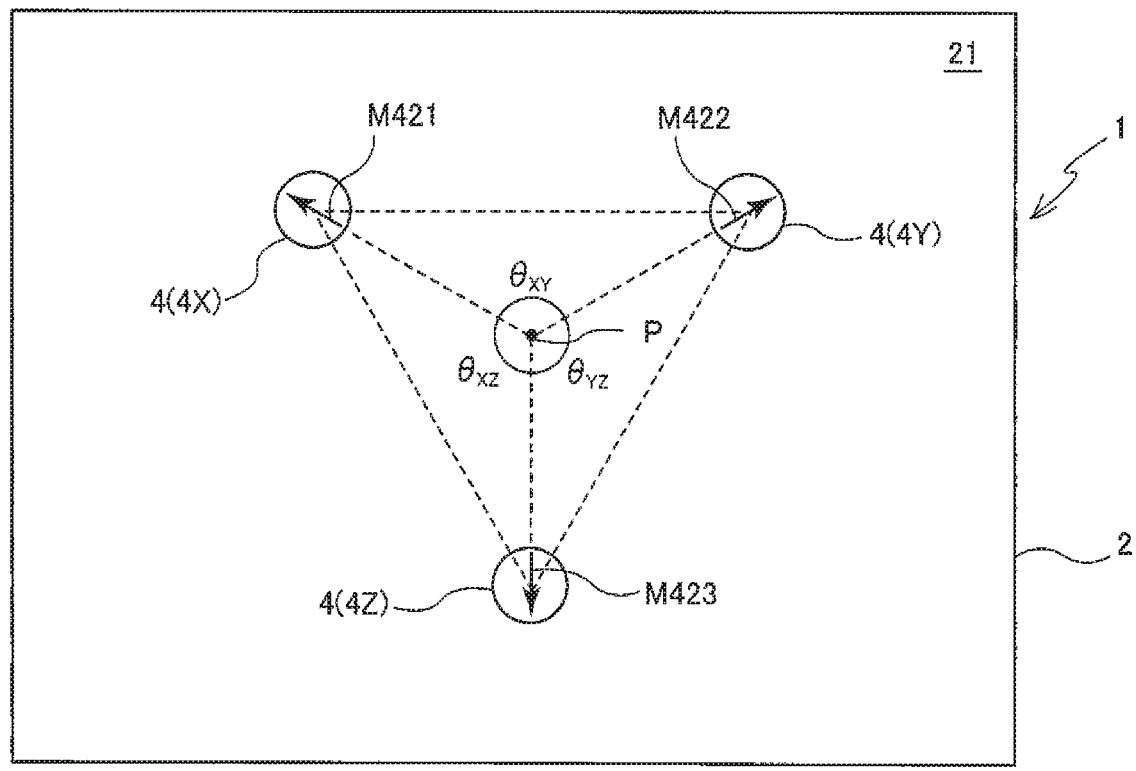
FIG. 4 is a plan view for describing the magnetization directions of the magnetization fixed layers of three magneto-resistive effect laminated bodies in the embodiment of the present invention.
Figure 5A:
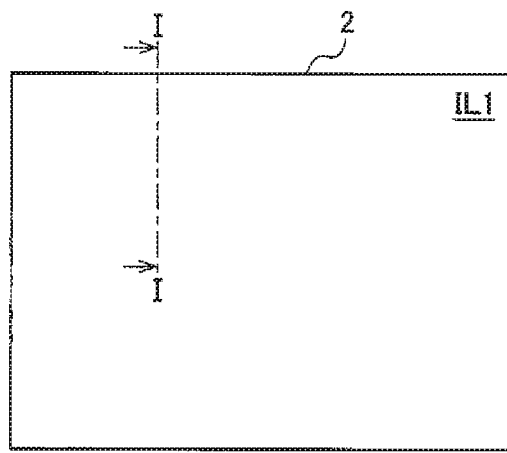
FIG. 5A is a process diagram (part 1) showing in a plane a manufacturing process for the triaxial magnetic sensor according to the embodiment of the present invention.
Figure 5B:
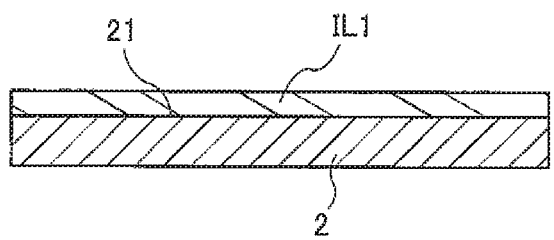
FIG. 5B is a cross-sectional view taken along line I-I in FIG. 5A.
Figure 6A:
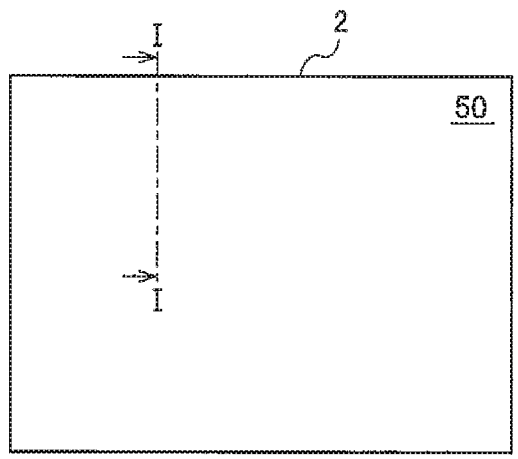
FIG. 6A is a process diagram (part 2) showing in a plane a manufacturing process for the triaxial magnetic sensor according to the embodiment of the present invention.
Figure 6B:
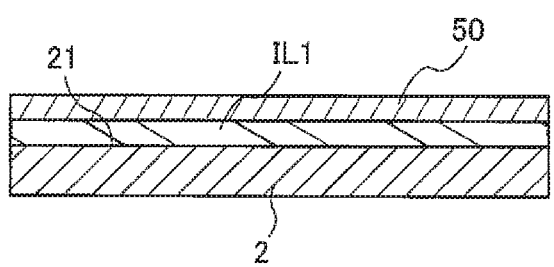
FIG. 6B is a cross-sectional view taken along line I-I in FIG. 6A.
Figure 7A:
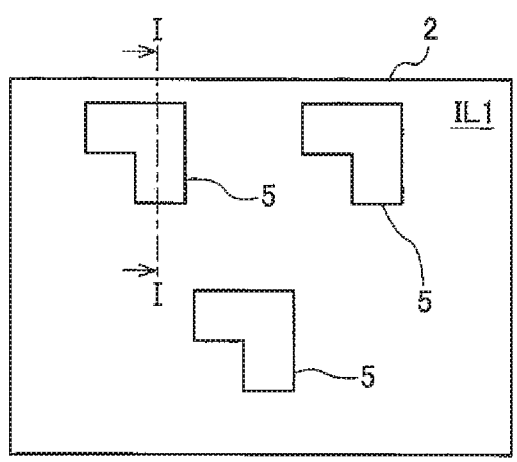
FIG. 7A is a process diagram (part 3) showing in a plane a manufacturing process for the triaxial magnetic sensor according to the embodiment of the present invention.
Figure 7B:
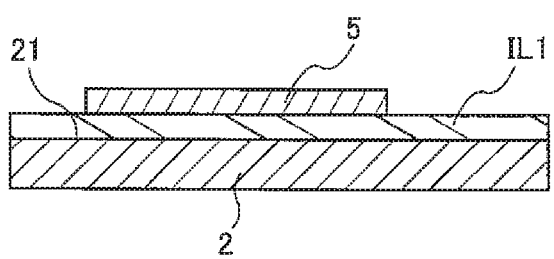
FIG. 7B is a cross-sectional view taken along line I-I in FIG. 7A.
Figure 8A:
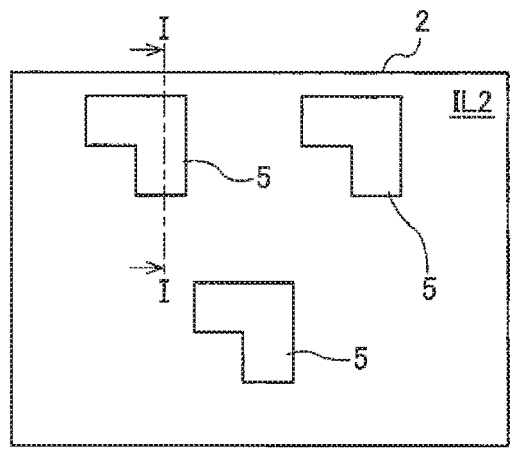
FIG. 8A is a process diagram (part 4) showing in a plane a manufacturing process for the triaxial magnetic sensor according to the embodiment of the present invention.
Figure 8B:
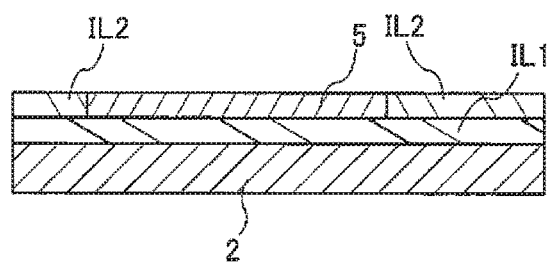
FIG. 8B is a cross-sectional view taken along line I-I in FIG. 8A.
Figure 9A:
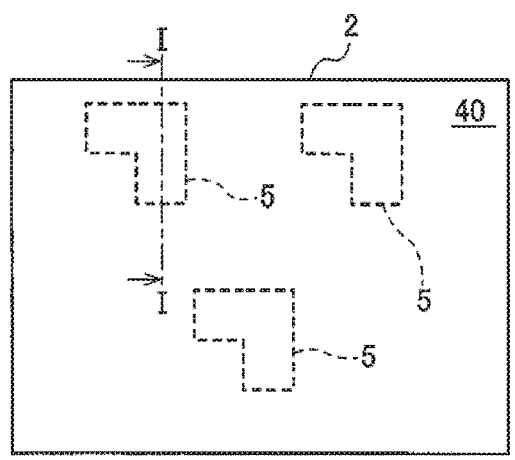
FIG. 9A is a process diagram (part 5) showing in a plane a manufacturing process for the triaxial magnetic sensor according to the embodiment of the present invention.
Figure 9B:
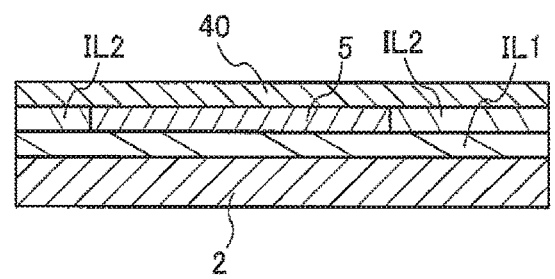
FIG. 9B is a cross-sectional view taken along line I-I in FIG. 9A.
Figure 10A:
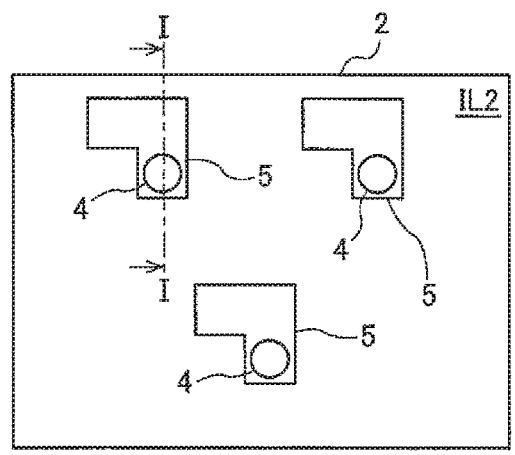
FIG. 10A is a process diagram (part 6) showing in a plane a manufacturing process for the triaxial magnetic sensor according to the embodiment of the present invention.
Figure 10B:
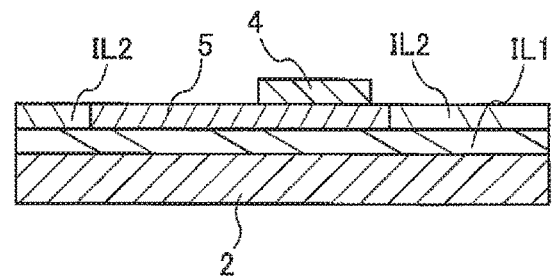
FIG. 10B is a cross-sectional view taken along line I-I in FIG. 10A.
Figure 11A:
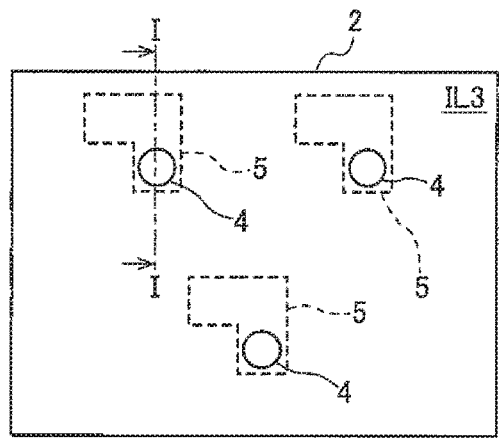
FIG. 11A is a process diagram (part 7) showing in a plane a manufacturing process for the triaxial magnetic sensor according to the embodiment of the present invention.
Figure 11B:
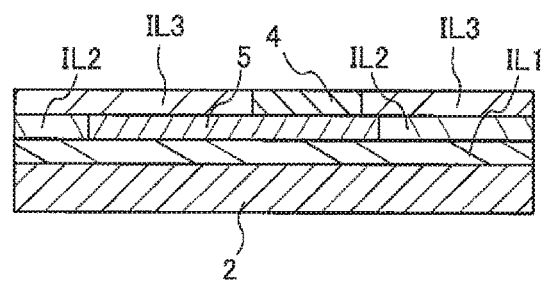
FIG. 11B is a cross-sectional view taken along line I-I in FIG. 11A.

A preferred embodiment of the present invention will be described with reference to the drawings. FIG. 1 is a plan view showing a summary configuration of a triaxial magnetic sensor according to this embodiment, FIG. 2 is a cross-sectional view showing a summary configuration of the triaxial magnetic sensor according to this embodiment, FIG. 3 is a cross-sectional view showing a summary configuration of a magneto-resistive effect laminated body in this embodiment and FIG. 4 is a plan view for describing the magnetization directions of the magnetization fixed layers of three magneto-resistive effect laminated bodies in this embodiment.

Figure 2:
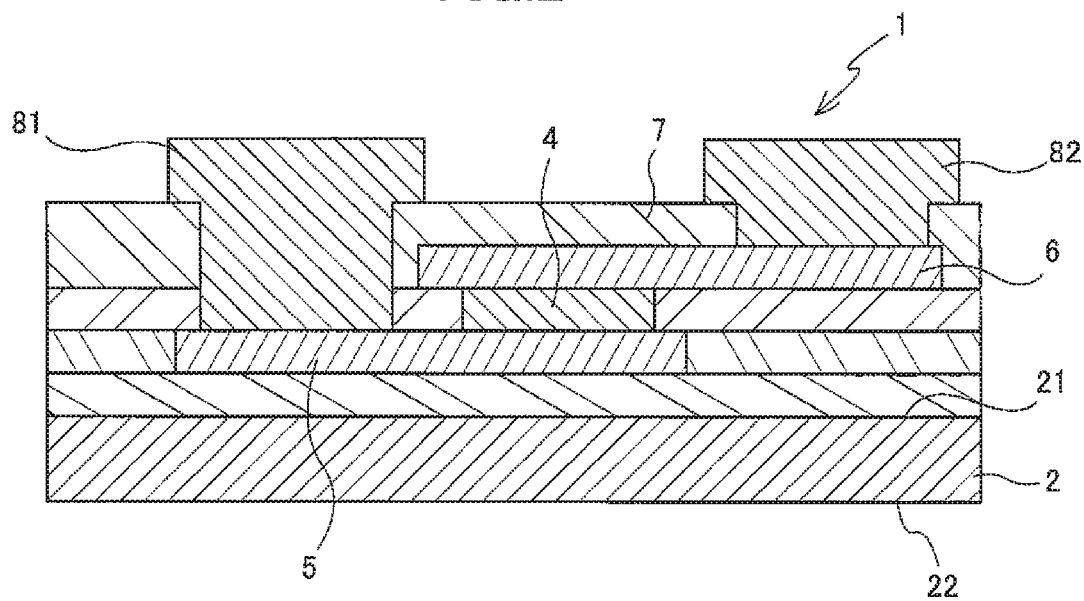
FIG. 2 is a cross-sectional view along line A-A in FIG. 1, showing a summary configuration of the triaxial magnetic sensor according to the embodiment of the present invention.

As shown in FIG. 1 and FIG. 2, a triaxial magnetic sensor 1 according to this embodiment is provided with a substrate 2 having a first surface 21 and a second surface 22, which is opposite to the first surface 21, and a magnetic sensor element group 3 provided on top of the first surface 21 of the substrate 2. As the substrate 2, the following, for example, can be used: a semiconductor substrate such as a silicon wafer or the like; a ceramic substrate such as an AlTiC substrate, an alumina substrate or the like; a resin substrate; a glass substrate, or the like. An insulating layer containing $Al_2O_3$ or the like may be placed on the first surface 21 of the substrate 2 in accordance with the type of the substrate 2.

The magnetic sensor element group 3 includes an x-axis magneto-resistive effect element 31 used to detect magnetic fields in the x-axis direction, y-axis magneto-resistive effect element 32 used to detect magnetic fields in the y-axis direction and a z-axis magneto-resistive effect element 33 used to detect magnetic fields in the z-axis direction. The x-axis direction and the y-axis direction are mutually orthogonal directions in a prescribed plane, and the z-axis direction is a direction orthogonal to the plane containing the x-axis direction and the y-axis direction.

The x-axis magneto-resistive effect element 31, the y-axis magneto-resistive effect element 32 and the z-axis magneto-resistive effect element 33 are all GMR elements or TMR elements, and are provided with a magneto-resistive effect laminated body 4, and first and second lead electrodes 5 and 6 electrically connected to the magneto-resistive effect laminated body 4.

The first lead electrode 5 and the second lead electrode 6 are configured by one type of conductive material out of, for example, Cu, Al, Au, Ta, Ti or the like, or a composite film of two or more conductive materials. The thickness thereof is around 0.3~2.0 μm each.

The first lead electrode 5 is placed on the first surface 21 of the semiconductor substrate 2. The second lead electrode 6 is placed to cover each magneto-resistive effect laminated body 4 placed on the first surface 21 of the semiconductor substrate 2. The first and second lead electrodes 5 and 6 in this embodiment have a roughly L-shape in the plan view, but the present invention is not limited to such an embodiment.

As shown in FIGS. 1~3, the magneto-resistive effect laminated body 4 has a magnetization fixed layer 42 in which the magnetization direction is fixed, a free layer 44 in which the magnetization direction changes in accordance with the direction of an impressed magnetic field, a non-magnetic layer 43 positioned between the magnetization fixed layer 42 and the free layer 44, and an antiferromagnetic layer 41, and has a roughly circular shape in the plan view.

The magneto-resistive effect laminated body 4 has a structure in which the antiferromagnetic layer 41, the magnetization fixed layer 42, the non-magnetic layer 43 and the free layer 44 are layered in this order from the first lead electrode 5 side. The free layer 44 is electrically connected to the second lead electrode 6, and the antiferromagnetic layer 41 is electrically connected to the first lead electrode 5. The magneto-resistive effect laminated body 4 may also have a structure in which the free layer 44, the non-magnetic layer 43, the magnetization fixed layer 42 and the antiferromagnetic layer 41 are layered in this order from the first lead electrode 5 side.

As the material composing the free layer 44, it is possible to use an alloy soft magnetic material such as Ni—Fe, Co—Fe or the like; an amorphous soft magnetic material such as Co—Fe—B, Co—Fe—Si—B or the like; a Heusler alloy such as Co—Mn—Si, Co—Fe—Mn—Si, Co—Fe—Ge—Ga, Co—Mn—Al or the like; an alloy having vertical magnetic anisotropy such as Co—Pt, Fe—Pt, Mn—Ga or the like; or a multilayer film material having a vertical magnetic anisotropy such as $[Co/Pd]_n$, $[Co/Pt]_n$, $[CoFe/Ni]_n$ (where n is the number of layers as the repeat unit for the layered structure in the brackets, and is an integer that is 2 or larger). The free layer 44 can be configured by a single layer film of the above-described materials or by a laminated film with two or more types arbitrarily selected from the above-described materials.

The free layer 44 may be configured with a laminated structure in which a first free layer, an intermediate layer made of a non-magnetic material such as Ta, Ru, W or the like, and a second free layer are layered in this order. Since the free layer 44 is configured by this kind of layered structure, it is possible to suppress deterioration in the MR ratio. Materials configuring the first free layer and the second free layer in this case can be arbitrarily selected from the above-described materials.

The free layer 44 may be configured by materials such that uniaxial magnetic anisotropy in which the film surface vertical direction is the axis of easy magnetization is induced. Through this, the uniaxial magnetic anisotropic energy Ku and the shape anisotropic energy Kd produced by a diamagnetic field working on the free layer 44 are counteracted and the effective vertical magnetic anisotropic energy Keff substantially becomes zero, so it is easy to cause the magnetization direction of the free layer 44 to be directed in various directions.

By using a material having a vertical magnetic anisotropy such as Co—Pt, Fe—Pt, $[Co/Pd]_n$ or the like as the material configuring the free layer 44, it is possible to suitably induce uniaxial magnetic anisotropy in which the film surface vertical direction is the axis of easy magnetization in the free layer 44. In addition, when the below-described non-magnetic layer 43 is configured by a metal oxide (for example, MgO), by configuring the layer in the free layer 44 touching the non-magnetic layer 43 by Co—Fe—B, it is possible to use the interface vertical magnetic anisotropy working on the interface between the metal oxide and the ferromagnetic material as the above-described uniaxial magnetic anisotropy.

The uniaxial magnetic anisotropic energy Ku and the shape anisotropic energy Kd in the free layer 44 can be appropriately adjusted by the composition of the alloy material configuring the free layer 44, the film thickness (the film thickness of each layer when the free layer 44 is configured by a plurality of layers of laminated films), and the shape, dimensions and the like of the free layer 44.

It is possible to use the same material of the various types of materials used as the above-described free layer 44 as the material configuring the magnetization fixed layer 42, and the magnetization fixed layer 42 is configured as a single layer film of the above-described materials or as a laminated film of two or more types arbitrarily selected from the above-described materials.

The magnetization fixed layer 42 may have a laminated structure in which a first magnetization layer, an intermediate layer made of a non-magnetic material such as Ru, Rh, Cr, Ir, Cu or the like, and a second magnetization fixed layer are layered in this order, and have a synthetic antiferromagnets (SAF) structure in which the magnetization of the first magnetization fixed layer and the magnetization of the second magnetization fixed layer are linked in a mutually antiparallel manner. It is possible to provide strong exchange coupling between the two ferromagnetic layers (the first magnetization fixed layer and the second magnetization fixed layer) configuring the magnetization fixed layer 42 and to effectively increase the exchange coupling force from the antiferromagnetic layer 41. In addition, it becomes possible to reduce the effect that the static magnetic field generated from the magnetization fixed layer 42 exerts on the free layer 44.

The magnetization fixed layer 42 is configured by materials such that uniaxial magnetic anisotropy in which the film surface vertical direction is the axis of easy magnetization can be induced. In the magnetization fixed layer 42, after setting the effective vertical magnetic anisotropic energy Keff provided from the uniaxial magnetic anisotropic energy Ku and the shape anisotropic energy Kd from the diamagnetic field acting on the magnetization fixed layer 42 within a prescribed range (a prescribed range close to zero), by inducing a moderate exchange magnetic anisotropy between the antiferromagnetic layer 41 and the magnetization fixed layer 42 (one-directional magnetic anisotropic energy Jk) at a prescribed angle, it is possible to fix the magnetization direction of the magnetization fixed layer 42 at an incline with a prescribed angle from the film surface (first surface 21 of the semiconductor substrate 2).

Like the free layer 44, the uniaxial magnetic anisotropic energy Ku and the shape anisotropic energy Kd in the magnetization fixed layer 42 can be appropriately adjusted by the composition of the alloy material configuring the magnetization fixed layer 42, the film thickness (the film thickness of each layer when the magnetization fixed layer 42 is configured by a plurality of layers of laminated films) the shape, the dimensions, and the like of the magnetization fixed layer 42.

As described above, the material and film thickness and the like of the free layer 44 and the magnetization fixed layer 42 can be set by the uniaxial magnetic anisotropic energy Ku and the shape anisotropic energy Kd. Consequently, the thicknesses of the free layer 44 and the magnetization fixed layer 42 are respectively set to, for example, around 1~10 nm after taking into consideration the effective vertical magnetic anisotropic energy Keff provided from the uniaxial magnetic anisotropic energy Ku and the shape anisotropic energy Kd.

The non-magnetic layer 43 is a spacer layer, and is a necessary film in order to realize a tunnel magneto-resistive effect (TMR effect) or a giant magneto-resistive effect (GMR effect) in the magneto-resistive effect laminated body 4 in this embodiment. As materials configuring the non-magnetic layer 43, the following can be cited: oxides such as MgO, Mg—Al—O, Al—O or the like; metal materials such as Cu, Au, Ag, Cr, Ag—Zn, Ni—Al or the like; or the like. The thickness of the non-magnetic layer 43 is around 0.1~5 nm.

The antiferromagnetic layer 41 is configured by at least one type of element selected from the group of Pt, Ru, Rh, Pd, Ni, Cu, Ir, Cr and Fe, an antiferromagnetic material containing Mn, and an oxide ferromagnetic material such as CoO, $Cr_2O_3$ or the like. The Mn content in the Mn-containing antiferromagnetic material is, for example, around 35~95 atom %. The Mn-containing antiferromagnetic material may be an ordered alloy such as L12-$Mn_3$Ir, L10-PtMn or the like, or may be a disordered alloy such as γ-MnIr or the like. The antiferromagnetic layer 41 configured by the antiferromagnetic material serves the role of fixing the magnetization direction of the magnetization fixed layer 42 through exchange coupling with the magnetization fixed layer 42.

The magneto-resistive effect laminated body 4 in this embodiment may contain an underlayer positioned between the antiferromagnetic layer 41 and the first lead electrode 5 and may contain a cap layer positioned between the free layer 44 and the second lead electrode 6.

As the material configuring the underlayer, it is possible, for example, to use a metal material such as Ta, Cr, Hf, Nb, Zr, Ti, Mo, W, Ru, Pt, Rh, Ir, Cu, Ag, Au or the like or an alloy material such as NiCr, CrTi or the like. The underlayer may have a single-layer structure of these or may have a laminated structure of two or more types. When Mn—Ir is used as the material configuring the antiferromagnetic layer 41, a large one-directional magnetic anisotropic energy Jk can be induced if the underlayer is configured by Ta/Ru or Ta/NiCr.

As the material composing the gap layer, it is possible for example to use a metal material such as Ru, Ta, W, Ti, Cr, Cu, Ag, Au or the like or an alloy material or the like containing at least one of these. The gap layer may contain an insulating material layer of an extremely thin film (for example, around 0.5 nm) of MgO, Al—O or the like. Through the material of the gap layer that contacts the free layer 44, it is possible to adjust the uniaxial magnetic anisotropic energy Ku of the free layer 44.

In this embodiment, the magnetization direction M42 of each magnetization fixed layer 42 of the x-axis magneto-resistive effect element 31, the y-axis magneto-resistive effect element 32 and the z-axis magneto-resistive effect element 33 is fixed in a direction inclined at a prescribed angle to the first surface 21 of the semiconductor substrate 2. Preferably, the magnetization direction M42 is fixed in a direction inclined at an angle $\theta_{M42}$ of 15~55° to the first surface 21 of the semiconductor substrate 2, and more preferably, is fixed in a direction inclined at an angle of 25~45°. Since the magnetization direction M42 of each magnetization fixed layer 42 has an angle of elevation with respect to the first surface 21 of the semiconductor substrate 2, it is possible for the magnetization directions M42 of each of the magnetization fixed layers 42 to be mutually orthogonal. Hence, in the x-axis magneto-resistive effect element 31, it is possible to detect magnetic field components in the orientation of the magnetization direction (x-axis direction) of that magnetization fixed layer 42, and similarly, in the y-axis magneto-resistive effect element 32 and the z-axis magneto-resistive effect element 33, it is possible to detect the magnetic field component in the orientation of the magnetization direction (y-axis direction and z-axis direction) of each of the magnetization fixed layers 42.

As shown in FIG. 4, when the magnetization directions M421~M423 of the magnetization fixed layers 42 of each of the magneto-resistive effect laminated bodies 4 (4X, 4Y and 4Z) of the x-axis magneto-resistive effect element 31, the y-axis magneto-resistive effect element 32 and the z-axis magneto-resistive effect element 33 are projected onto the first surface 21 of the semiconductor substrate 2, the various magnetization directions M421~M423 projected onto the first surface 21 are fixed to face in directions mutually differing by 110~130°. That is to say, the angle $\theta_{XY}$ between the magnetization direction M421 of the magnetization fixed layer 42 of the x-axis magneto-resistive effect element 31 and the magnetization direction M422 of the magnetization fixed layer 42 of the y-axis magneto-resistive effect element 32, the angle $\theta_{XZ}$ between the magnetization direction M421 of the magnetization fixed layer 42 of the x-axis magneto-resistive effect element 31 and the magnetization direction M423 of the magnetization fixed layer 42 of the z-axis magneto-resistive effect element 33 and the angle $\theta_{YZ}$ between the magnetization direction M422 of the magnetization fixed layer 42 of the y-axis magneto-resistive effect element 32 and the magnetization direction M423 of the magnetization fixed layer 42 of the z-axis magneto-resistive effect element 33 are each 110~130°. By having the magnetization direction M42 (M421~M423) of each of the magnetization fixed layers 42 fixed to be inclined at a prescribed angle $\theta_{M42}$ with respect to the first surface 21 of the semiconductor substrate 2 and also facing directions that mutually differ by 110~130°, it is possible to make the magnetization directions M42 (M421~M423) of each of the magnetization fixed layers 42 substantially orthogonal to each other, and it is possible to detect magnetic fields of the three axial directions with high precision.

Each of the magneto-resistive effect laminated bodies 4 of the x-axis magneto-resistive effect element 31, the y-axis magneto-resistive effect element 32 and the z-axis magneto-resistive effect element 33 is positioned with a spacing of roughly 120° in a circumferential direction about a prescribed point P. That is, each of the magneto-resistive effect laminated bodies 4 of the x-axis magneto-resistive effect element 31, the y-axis magneto-resistive effect element 32 and the z-axis magneto-resistive effect element 33 is positioned to define an equilateral triangle, the center of which is at the prescribed point P.

The triaxial magnetic sensor 1 according to this embodiment is further provided with a protective layer 7 covering the second lead electrode 6, and a first electrode pad 81 and a second electrode pad 82 made of Au or the like and electrically connected to the first lead electrode 5 and the second lead electrode 6, respectively.

The method of manufacturing the triaxial magnetic sensor 1 having the above-described configuration will be described. FIGS. 5A~15A are process diagrams sequentially showing the manufacturing process for the triaxial magnetic sensor 1 according to this embodiment in a plane, and FIGS. 5B~15B are cross-sectional views taken along line I-I in FIGS. 5A~15A.

An insulating layer ILA and a first conductive material film 50 are layered and formed through sputtering or the like in this order on the first surface 21 of the semiconductor substrate 2, and via a photolithography process, the first lead electrode 5 of each of the x-axis magneto-resistive effect element 31, the y-axis magneto-resistive effect element 32 and the z-axis magneto-resistive effect element 33 is formed. An insulating layer IL2 is formed to surround the first lead electrode 5 (see FIGS. 5A~8A, FIGS. 5B~8B).

Next, a magneto-resistive effect film (a laminated film in which an antiferromagnetic film, a ferromagnetic film, a non-magnetic film and a ferromagnetic film are layered in this order) 40 is formed through sputtering or the like to cover the first lead electrode 5 (see FIGS. 9A, 9B), and via a photolithography process, the magneto-resistive effect laminated body 4 having a roughly circular shape when viewed in the plane is formed in a prescribed region on the first lead electrode 5, and an insulating layer IL3 is formed to surround the magneto-resistive effect laminated body 4 (see FIGS. 10A~11A, FIGS. 10B~11B). Each of the magneto-resistive effect laminated bodies 4 is formed to be positioned with a spacing of 120° in the circumferential direction, centered on a prescribed point P.

Figure 12A:
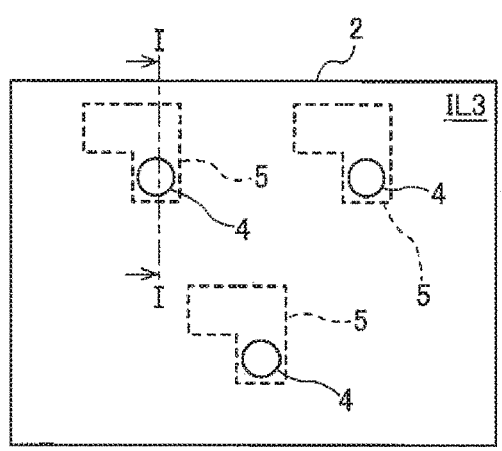
FIG. 12A is a process diagram (part 8) showing in a plane a manufacturing process for the triaxial magnetic sensor according to the embodiment of the present invention.
Figure 12B:
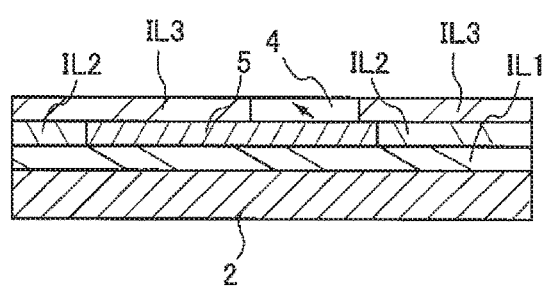
FIG. 12B is a cross-sectional view taken along line I-I in FIG. 12A.

Next, a magnetic field is impressed using a solenoid device or the like, while undertaking an annealing process on the magneto-resistive effect laminated body 4 (see FIGS. 12A, 12B). At this time, the solenoid device is installed at a position separated in the vertical direction with respect to the second surface 22 of the semiconductor substrate 2, from a position corresponding to the prescribed point P in the second surface 22 of the semiconductor substrate 2. Furthermore, a magnetic field in a direction inclined at a desired angle with respect to the first surface 21 of the semiconductor substrate 2 is impressed on each of the magneto-resistive effect laminated bodies 4 to induce a prescribed exchange magnetic anisotropy between the antiferromagnetic layer 41 and the magnetization fixed layer 42, in accordance with the constituent materials of the various layers of each of the magneto-resistive effect laminated bodies 4, the film thicknesses, dimensions and shapes of each of the layers, and the effective vertical magnetic anisotropic energy Keff provided from the vertical magnetic anisotropic energy Ku of the magnetization fixed layer 42 and the shape anisotropic energy Kd. For example, by controlling the impressed electric current on the coil of the solenoid device and the separation between the solenoid device and the second surface 22 of the semiconductor substrate 2 in accordance with the angle (angle with respect to the in-plane direction of the film) of magnetization of the magnetization fixed layer 42 in the state prior to impressing of the magnetic field, it is possible to impress a magnetic field in a direction inclined at the desired angle on each of the magneto-resistive effect laminated bodies 4. Through this, it is possible to fix the magnetization direction of the magnetization fixed layer 42 in each of the magneto-resistive effect laminated bodies 4 in a direction inclined at an angle $\theta_{M42}$ of 15~55°, and preferably 25~45°, with respect to the first surface 21 of the semiconductor substrate 2, while facing directions mutually differing by 110~130°.

Figure 13A:
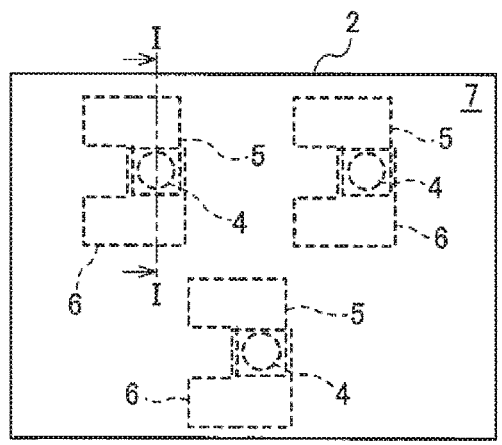
FIG. 13A is a process diagram (part 9) showing in a plane a manufacturing process for the triaxial magnetic sensor according to the embodiment of the present invention.
Figure 13B:
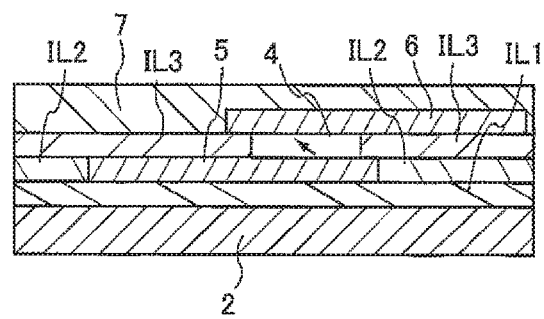
FIG. 13B is a cross-sectional view taken along line I-I in FIG. 13A.

A second conductive material film is formed through sputtering or the like on each of the magneto-resistive effect laminated bodies 4, the second lead electrode 6 electrically connected to each of the magneto-resistive effect laminated bodies 4 is formed via a photolithography process, and the protective layer 7 covering the second lead electrode 6 is formed (see FIGS. 13A, 13B).

Figure 14A:
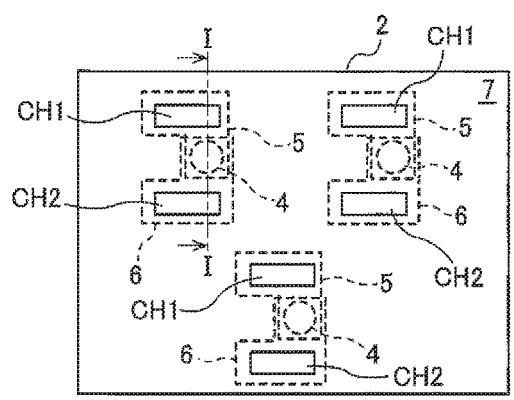
FIG. 14A is a process diagram (part 10) showing in a plane a manufacturing process for the triaxial magnetic sensor according to the embodiment of the present invention.
Figure 14B:
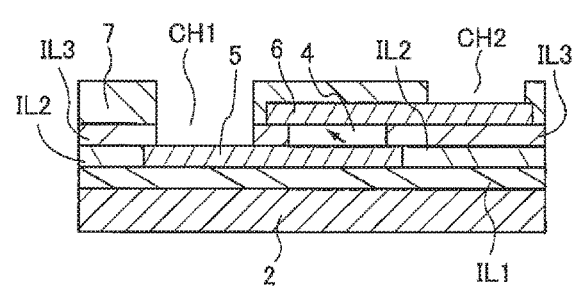
FIG. 14B is a cross-sectional view taken along line I-I in FIG. 14A.
Figure 15A:
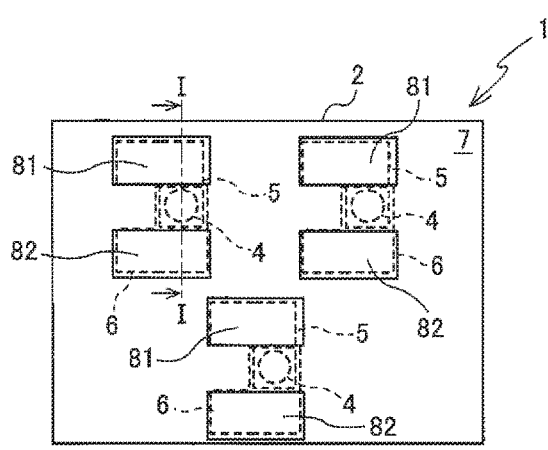
FIG. 15A is a process diagram (part 11) showing in a plane a manufacturing process for the triaxial magnetic sensor according to the embodiment of the present invention.
Figure 15B:
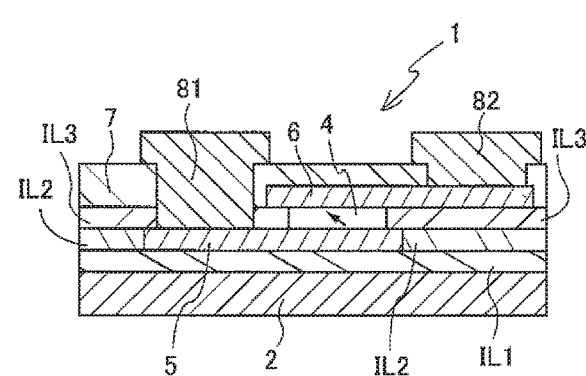
FIG. 15B is a cross-sectional view taken along line I-I in FIG. 15A.

Next, contact holes CH1 and CH2 are formed in the protective layer 7, and a section of the first lead electrode 5 and the second lead electrode 6 is exposed (see FIGS. 14A, 14B). Finally, Au or the like is buried in the contact holes CH1 and CH2 to form the first and second electrode pads 81 and 82 (see FIGS. 15A, 15B). In this manner, the triaxial magnetic sensor 1 according to this embodiment is manufactured.

As described above, in the triaxial magnetic sensor 1 according to this embodiment, the x-axis magneto-resistive effect element 31, the y-axis magneto-resistive effect element 32 and the z-axis magneto-resistive effect element 33 all contain the magneto-resistive effect laminated bodies 4 formed in layers in a direction substantially orthogonal to the first surface 21 of the semiconductor substrate 2, and each of the magneto-resistive effect laminated bodies 4 is manufactured through the same process and thus has substantially the same properties. Furthermore, since the magnetization direction of the magnetization fixed layer 42 of each of the magneto-resistive effect laminated bodies 4 is fixed in a direction inclined at an angle $\theta_{M42}$ of 15~55°, and preferably 25~45°, with respect to the first surface 21 of the semiconductor substrate 2 and to face in directions mutually differing by 110~130°, they are mutually orthogonal to respectively correspond to the three axial directions. Accordingly, with the triaxial magnetic sensor 1 according to this embodiment, it is possible to detect magnetic fields in the three axial directions with high precision.

The above-described embodiment was described to facilitate understanding of this invention and is not intended to limit. Accordingly, the various elements disclosed in the above-described embodiment shall be construed to include all design variations, equivalents and so forth belonging to the technical scope of the invention.

EMBODIMENTS

Below, the present invention is described in further detail by citing embodiments, but this is not intended to limit.

Embodiment 1

The x-axis magneto-resistive effect element 31, the y-axis magneto-resistive effect element 32 and the z-axis magneto-resistive effect element 33 including the magneto-resistive effect laminated bodies 4 having the structure shown in FIGS. 1~4, a dimension of φ 1 μm, a circular shape when viewed in the plane, and the layer structure, constituent materials and film thickness of each layer as indicated in Table 1 were manufactured on the first surface 21 of a Si substrate 2 by the method shown in FIGS. 5A~15A and FIGS. 5B~15B. Because the effective vertical magnetic anisotropic energy Keff provided from the vertical magnetic anisotropic energy Ku and the shape anisotropic energy Kd of the magnetization fixed layer 42 is −0.16 erg/cm$^2$, a magnetic field was impressed in a direction inclined at 24° from perpendicular to the surface of each of the magneto-resistive effect laminated bodies 4 to induce a prescribed exchange magnetic anisotropy (Jk=0.3 erg/cm$^2$) between the magnetization fixed layer 42 and the antiferromagnetic layer 41. As a result, it was possible to fix the magnetization direction of the magnetization fixed layer 42 in a direction inclined at an angle of 35.3° to the first surface 21 of the Si substrate 2.

TABLE 1

| Layer structure | Constituent material | Film thickness (nm) |
| --- | --- | --- |
| Cap layer | Ru | 8 |
|  | Ta | 1 |
|  | Ru | 1 |
| Free layer | [Co/Pd]4 | 1.6 (Co = 0.2, Pd = 0.2) |
|  | Ta | 0.2 |
|  | CoFeB | 1.5 |
|  | CoFe | 0.4 |
| Non-magnetic layer | MgO | 2 |
| Magnetization fixed layer | CoFeB | 1 |
|  | CoFe | 0.5 |
| Antiferromagnetic layer | MnIr | 8 |
| Underlayer | Ru | 2 |
|  | Ta | 2 |

Embodiment 2

The x-axis magneto-resistive effect element 31, the y-axis magneto-resistive effect element 32 and the z-axis magneto-resistive effect element 33 including the magneto-resistive effect laminated bodies 4 having the structure shown in FIGS. 1~4, a dimension of φ 1 μm, a circular shape when viewed in the plane, and the layer structure, constituent materials and film thickness of each layer as indicated in Table 2 were manufactured on the first surface 21 of a Si substrate 2 by the method shown in FIGS. 5A~15A and FIGS. 5B~15B. Because the effective vertical magnetic anisotropic energy Keff provided from the vertical magnetic anisotropic energy Ku and the shape anisotropic energy Kd of the magnetization fixed layer 42 is 0.15 erg/cm$^2$, a magnetic field was impressed in a direction inclined at 75° from perpendicular to the surface of each of the magneto-resistive effect laminated bodies 4 to induce a prescribed exchange magnetic anisotropy (Jk=0.4 erg/cm$^2$) between the magnetization fixed layer 42 and the antiferromagnetic layer 41. As a result, it was possible to fix the magnetization direction of the magnetization fixed layer 42 in a direction inclined at an angle of 35.3° to the first surface 21 of the Si substrate 2.

TABLE 2

| Layer structure | Constituent material | Film thickness (nm) |
| --- | --- | --- |
| Cap layer | Ru | 8 |
|  | Ta | 1 |
|  | Ru | 1 |
| Free layer | [Co/Pd]4 | 1.6 (Co = 0.2, Pd = 0.2) |
|  | Ta | 0.2 |
|  | CoFeB | 1.5 |
|  | CoFe | 0.4 |
| Non-magnetic layer | MgO | 2 |
| Magnetization fixed layer | CoFeB | 1.5 |
|  | [Pd/Co]3 | 1.95 (Pd = 0.45, Co = 0.2) |
|  | CoFe | 1 |
| Antiferromagnetic layer | MnIr | 8 |
| Underlayer | Ru | 2 |
|  | Ta | 2 |

EXPLANATION OF REFERENCE SYMBOLS

1 Triaxial magnetic sensor
2 Semiconductor substrate (substrate)
21 First surface
22 Second surface
3 Magnetic sensor element group
31 X-axis magneto-resistive effect element (first magnetic sensor element)
32 Y-axis magneto-resistive effect element (second magnetic sensor element)
33 Z-axis magneto-resistive effect element (third magnetic sensor element)
4 Magneto-resistive effect laminated body (first through third magneto-resistive effect elements)
42 Magnetization fixed layer
44 Free layer

The invention claimed is:
1. A triaxial magnetic sensor comprising:
a substrate including a first surface and a second surface opposite to the first surface; and
a magnetic sensor element group provided on the first surface of the substrate;
wherein the magnetic sensor element group includes a first magnetic sensor element for detecting magnetism in a first axial direction, a second magnetic sensor element for detecting magnetism in a second axial direction and a third magnetic sensor element for detecting magnetism in a third axial direction, the first axial direction and the second axial direction are mutually orthogonal directions on a plane containing the first axial direction and the second axial direction, the third axial direction is a direction orthogonal to the plane containing the first axial direction and the second axial direction, the first through third magnetic sensor elements contain first through third magneto-resistive effect elements, respectively, the first through third magneto-resistive effect elements are all laminated bodies containing at least a magnetization fixed layer and a free layer, the magnetization direction of the magnetization fixed layer of the first magneto-resistive effect element is fixed in a first direction inclined at a first angle of 15~55° with respect to the first surface of the substrate, the magnetization direction of the magnetization fixed layer of the first magneto-resistive effect element is inclined with respect to a film surface of the first magneto-resistive effect element;

the magnetization direction of the magnetization fixed layer of the second magneto-resistive effect element is fixed in a second direction inclined at a second angle of 15~55° with respect to the first surface of the substrate, the magnetization direction of the magnetization fixed layer of the second magneto-resistive effect element is inclined with respect to a film surface of the second magneto-resistive effect element;

the magnetization direction of the magnetization fixed layer of the third magneto-resistive effect element is fixed in a third direction inclined at a third angle of 15~55° with respect to the first surface of the substrate, the magnetization direction of the magnetization fixed layer of the third magneto-resistive effect element is inclined with respect to a film surface of the third magneto-resistive effect element;

the first direction, the second direction and the third direction are all different directions; and in a planar view viewed from above the first surface of the substrate, when the magnetization direction of the magnetization fixed layer of the first magneto-resistive effect element, the magnetization direction of the magnetization fixed layer of the second magneto-resistive effect element and the magnetization direction of the magnetization fixed layer of the third magneto-resistive effect element are respectively projected onto the first surface of the substrate, the projected magnetization directions are fixed to face directions mutually differing by 110~130°.

2. The triaxial magnetic sensor according to claim 1, wherein each of the first through third magneto-resistive effect elements is a laminated body in which the magnetization fixed layer and the free layer are layered along a direction orthogonal to the first surface of the substrate.

3. The triaxial magnetic sensor according to claim 1, wherein the magneto-resistive effect elements are GMR elements or TMR elements.

4. A method of manufacturing a triaxial magnetic sensor, wherein the triaxial magnetic sensor comprises:

a substrate including a first surface and a second surface opposite to the first surface; and a magnetic sensor element group provided on the first surface of the substrate, wherein the magnetic sensor element group includes a first magnetic sensor element for detecting magnetism in a first axial direction, a second magnetic sensor element for detecting magnetism in a second axial direction and a third magnetic sensor element for detecting magnetism in a third axial direction, the first axial direction and the second axial direction are mutually orthogonal directions on a plane containing the first axial direction and the second axial direction, the third axial direction is a direction orthogonal to the plane containing the first axial direction and the second axial direction, the first through third magnetic sensor elements contain first through third magneto-resistive effect elements, respectively, the first through third magneto-resistive effect elements are all laminated bodies containing at least a magnetization fixed layer and a free layer, the magnetization direction of the magnetization fixed layer of the first magneto-resistive effect element is fixed in a first direction inclined at a first angle of 15~55° with respect to the first surface of the substrate, the magnetization direction of the magnetization fixed layer of the second magneto-resistive effect element is fixed in a second direction inclined at a second angle of 15~55° with respect to the first surface of the substrate, the magnetization direction of the magnetization fixed layer of the third magneto-resistive effect element is fixed in a third direction inclined at a third angle of 15~55° with respect to the first surface of the substrate; and the first direction, the second direction and the third direction are all different directions; and wherein the method includes:

a process for forming a laminated film including at least an antiferromagnetic film configuring the magnetization fixed layer and a magnetic film configuring the free layer, on the first surface of the substrate;

a process for forming first through third laminated structures by milling the laminated film; and a process for causing the magnetization direction of each magnetization fixed layer of the first through third magneto-resistive effect elements to be fixed at the first through third angles with respect to the first surface of the substrate, by simultaneously impressing a magnetic field on the first through third laminated structures.

5. The method of manufacturing the triaxial magnetic sensor according to claim 4, wherein in a planar view viewed from above the first surface of the substrate, when the magnetization direction of the magnetization fixed layer of the first laminated structure, the magnetization direction of the magnetization fixed layer of the second laminated structure and the magnetization direction of the magnetization fixed layer of the third laminated structure are respectively projected onto the first surface of the substrate, the projected magnetization directions are fixed to face directions mutually differing by 110~130°.

6. The method of manufacturing the triaxial magnetic sensor according to claim 4, wherein:

in a planar view viewed from above the first surface of the substrate, the first through third laminated structures are positioned with a spacing of 120° in the circumferential direction centered on a prescribed point on the first surface; and a magnetic field is impressed on the first through third laminated structures from a magnetic field impressing device, while the magnetic field impressing device is positioned at a position on the second surface side of the substrate facing a prescribed point on the first surface.

* * * * *